United States Patent
Dennard et al.

(10) Patent No.: US 6,664,598 B1
(45) Date of Patent: Dec. 16, 2003

(54) POLYSILICON BACK-GATED SOI MOSFET FOR DYNAMIC THRESHOLD VOLTAGE CONTROL

(75) Inventors: Robert H. Dennard, New Rochelle, NY (US); Wilfried E. Haensch, Somers, NY (US); Hussein I. Hanafi, Basking Ridge, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/235,169

(22) Filed: Sep. 5, 2002

(51) Int. Cl.[7] .............................. H01L 27/01
(52) U.S. Cl. ..................... 257/347; 257/350
(58) Field of Search ............... 257/487, 288, 257/347, 350; 438/164, 165

(56) References Cited

U.S. PATENT DOCUMENTS

| | | | |
|---|---|---|---|
| 6,074,209 A | * | 6/2000 | Houston ................. 438/289 |
| 6,275,094 B1 | * | 8/2001 | Cranford, Jr. et al. ...... 327/534 |
| 6,359,312 B1 | * | 3/2002 | Komatsu .................. 257/354 |
| 6,383,904 B1 | * | 5/2002 | Yu ......................... 438/589 |
| 6,391,695 B1 | * | 5/2002 | Yu ......................... 438/166 |
| 6,392,277 B1 | * | 5/2002 | Mitani et al. ............. 257/347 |
| 6,423,599 B1 | * | 7/2002 | Yu ......................... 438/283 |
| 6,432,754 B1 | * | 8/2002 | Assaderaghi et al. ....... 438/149 |
| 6,441,436 B1 | * | 8/2002 | Wu et al. ................. 257/350 |

* cited by examiner

Primary Examiner—David Nelms
Assistant Examiner—Thao P Le
(74) Attorney, Agent, or Firm—Scully, Scott, Murphy, Presser; Richard M. Ludwin

(57) ABSTRACT

A method of forming a silicon-on-insulator (SOI) metal oxide semiconductor field effect transistor (MOSFET) device is provided. The SOI MOSFET device includes a polysilicon back-gate which controls the threshold voltage of a polysilicon-containing front-gate. The back-gate functions as a dynamic threshold voltage control system in the SOI MOSFET device because it is suitable for use during circuit/system active periods and during circuit/system idle periods.

9 Claims, 16 Drawing Sheets

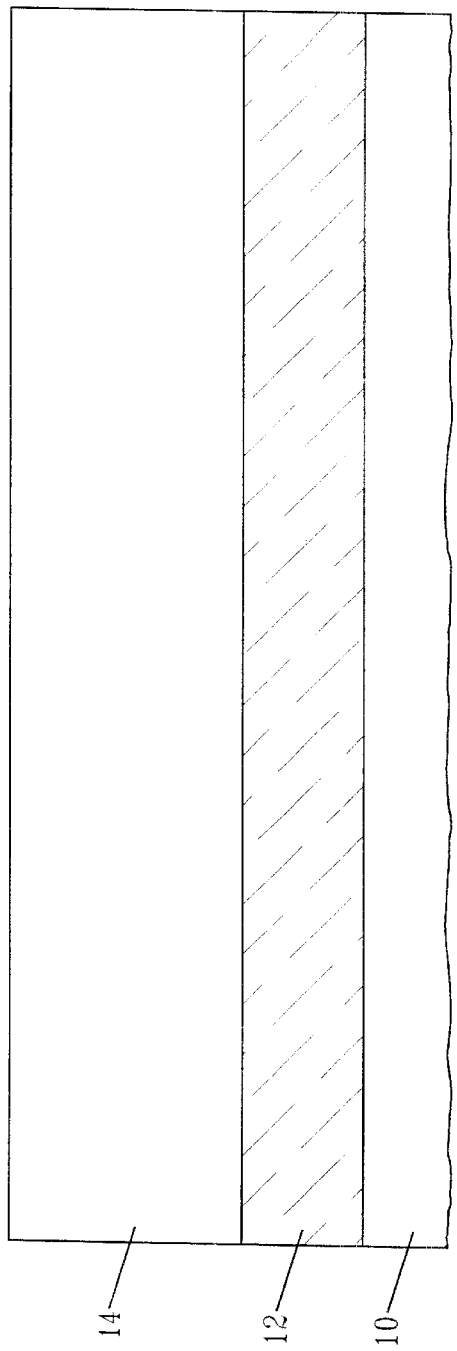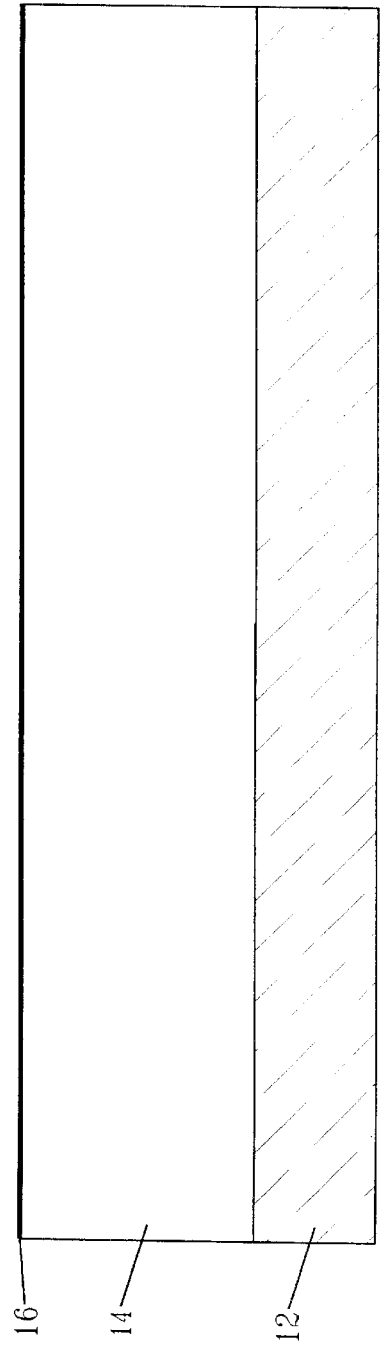

POLYSILICON BACK-GATED SOI MOSFET FOR DYNAMIC THRESHOLD VOLTAGE CONTROL

RELATED APPLICATIONS

This application is related to co-assigned U.S. application Ser. No. 10/235,147 which is being filed concurrently with the present invention.

FIELD OF THE INVENTION

The present invention relates to semiconductor device fabrication, and more particularly to a method of fabricating a polysilicon back-gated silicon-on-insulator (SOI) metal oxide semiconductor field effect transistor (MOSFET) in which a polysilicon back-gate controls the threshold voltage of the front-gated device. The present invention also relates to a back-gated SOI MOSFET device comprising, among other elements, a polysilicon back-gate that controls the threshold voltage of the device.

BACKGROUND OF THE INVENTION

Simultaneous reduction of supply and threshold voltages for low-power silicon-on-insulator (SOI) CMOS design without suffering performance losses will eventually reach the limit of diminishing returns as static power dissipation becomes a significant portion of the total power equation. In order to meet the opposing requirements of high-performance during circuit/system active periods, and low-power, during circuit/system idle periods, a dynamic threshold voltage control scheme is needed.

For SOI metal oxide field effect transistors (MOSFETs), there are two modes of operation: 1) fully depleted, and 2) partially depleted channel region. In conventional strongly fully depleted SOI devices, the silicon film thickness is usually less than or equal to half the depletion width of the bulk device. The surface potentials at the front and back interfaces are strongly coupled to each other and capacitively coupled to the front-gate and substrate through the front-gate dielectric and the buried oxide, respectively. Therefore, the potential throughout the silicon film, and hence the charge, is determined by the bias conditions on both the front-gate and the substrate. By replacing the substrate with a back-gate, the device becomes a dual-gated device.

The fully depleted design is unique to SOI because the front-gate and the back-gate both have control of the charge in the silicon film. In the strongly partially depleted device, the back-gate or the substrate has no influence on the front surface potential. In the middle regime, the device is nominally partially depleted and can become fully depleted by applying bias, thus, coupling of the front and back surface potentials still occurs.

To date, no adequate dynamic threshold voltage control schemes are present in conventional SOI MOSFET devices; therefore, as these devices are continually being scaled down to smaller sizes, the devices will become extremely leaky when operating under low-power conditions, i.e., when the devices are idle.

In view of the state of the art mentioned above, there is a continued need for providing a SOI MOSFET device that includes a dynamic threshold voltage control scheme that works under circuit/system active periods, as well as circuit/system idle periods.

SUMMARY OF THE INVENTION

The present invention is directed to a SOI MOSFET device that includes a dynamic threshold voltage control scheme, which is suitable for both high-performance, i.e., circuit/system active periods, and low-power, i.e., circuit/system idle periods, applications. Specifically, the present invention provides a SOI MOSFET device comprising a polysilicon back-gate region which controls the threshold voltage of the front-gate. NMOS and PMOS back-gates are also present which are switched independently of each other and the back-gate. For high-performance and low-power applications, the threshold voltage would be raised during system/circuit idle periods to reduce the static leakage current, and lowered during circuit/system active periods to achieve high-performance.

In the device aspect of the present invention, a SOI MOSFET device is provided that comprises:

an implanted back-gate region located atop an oxide layer, wherein a surface portion of said implanted back-gate region includes a back-gate oxide formed thereon;

a body region located atop said back-gate oxide;

a gate dielectric located atop a surface portion of said body region; and a polysilicon gate located atop a portion of said gate dielectric.

The present invention also provides a method of fabricating the above-mentioned SOI MOSFET device. The inventive method utilizes processing steps that are compatible with conventional CMOS processes. Specifically, the method of the present invention comprises the steps of:

providing a structure including at least a back-gate oxide located atop a Si-containing layer, said Si-containing layer is a component of a SOI wafer;

forming alternating regions of back-gate-STI and first polysilicon atop said back-gate oxide;

forming a second polysilicon layer atop said alternating regions of back-gate-STI and first polysilicon;

implanting a back-gate region into said polysilicon layers;

forming an oxide layer on said second polysilicon layer;

bonding a holding-substrate wafer to said oxide layer and flipping the bonded structure to expose layers of said SOI wafer;

removing selective layers of said SOI wafer stopping on said Si-containing layer;

converting a portion of said Si-containing layer into a body region; and forming a gate dielectric and a polysilicon gate atop said body region.

Additional BEOL processing steps, as described herein below, can also be performed following polysilicon gate formation.

BRIEF DESCRIPTION OF THE DRAWINGS

FIGS. 1–17 are pictorial representations (through cross-sectional views) illustrating the basic processing steps that are employed in the present invention for fabricating a SOI MOSFET device comprising a polysilicon back-gate which controls the threshold voltage of the front-gate.

DETAILED DESCRIPTION OF THE INVENTION

Figure 3:
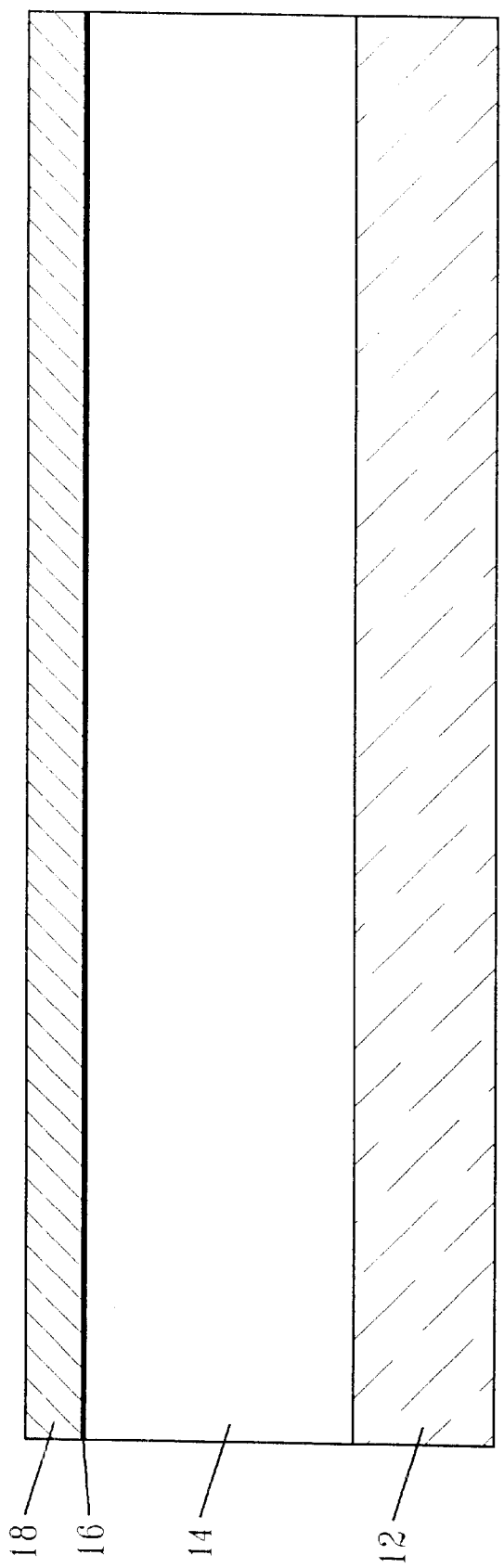

The present invention, which provides a SOI MOSFET device comprising a polysilicon back-gate that controls the threshold voltage of the front-gate as well as a method of fabricating such a device, will now be described in greater detail by referring to the drawings that accompany the present application.

Reference is first made to FIG. 1 which illustrates an initial SOI wafer that can be employed in the present invention. Specifically, the initial SOI wafer of FIG. 1 comprises buried oxide layer 12 which electrically isolates Si-containing substrate 10 from Si-containing layer 14. It is noted that Si-containing layer 14 is the SOI layer in which active device regions can be formed therein. The term "Si-containing" as used herein denotes a material that includes at least silicon. Illustrative examples of such Si-containing materials include, but are not limited to: Si, SiGe, SiC, SiGeC, Si/Si, Si/SiC, and Si/SiGeC. Buried oxide region 12 may be a continuous buried oxide region, as is shown in FIG. 1, or it may be a non-continuous, i.e., patterned, buried oxide region (not shown). The non-continuous buried oxide regions are discrete and isolated regions or islands that are surrounded by Si-containing layers, i.e., layers 10 and 14.

It is noted that at this point of the present invention Si-containing layer 14 is lightly doped with an N or P-type dopant. The term "lightly doped" is used herein to denote a dopant concentration of about 1E14 to about 5E15 atoms/$cm^3$, with a dopant concentration of about 2E15 atoms/$cm^3$ being more highly preferred.

The SOI wafer may be formed utilizing conventional SIMOX (separation by ion implantation of oxygen) processes well-known to those skilled in the art, as well as the various SIMOX processes mentioned in co-assigned U.S. patent applications Ser. No. 09/861,593, filed May 21, 2001; Ser. No. 09/861,594, filed May 21, 2001; Ser. No. 09/861,590, filed May 21, 2001; Ser. No. 09/861,596, filed May 21, 2001; and Ser. No. 09/884,670, filed Jun. 19, 2001 as well as U.S. Pat. No. 5,930,634 to Sadana, et al., the entire contents of each are incorporated herein by reference. Alternatively, the SOI wafer may be made using other conventional processes including, for example, a thermal bonding and cutting process.

In addition to the above techniques, the initial SOI wafer employed in the present invention may be formed by deposition processes as well as lithography and etching (employed when fabricating a patterned substrate). Specifically, the initial structure may be formed by depositing an oxide film atop a surface of a Si-containing substrate, via a conventional deposition or thermal growing process; optionally patterning the oxide film by employing conventional lithography and etching; and thereafter forming a Si-containing layer atop the oxide layer using a conventional deposition process including, for example, chemical vapor deposition (CVD), plasma-assisted CVD, sputtering, evaporation, chemical solution deposition or epitaxial Si growth.

The thickness of the various layers of the initial SOI wafer may vary depending on the process used in making the same. Typically, however, Si-containing layer 14 has a thickness of from about 100 to about 200 nm. In the case of buried oxide layer 12, that layer may have a thickness of from about 100 to about 400 nm. The thickness of the Si-containing substrate layer, i.e., layer 10, is inconsequential to the present invention. It is noted that the thicknesses provided above are exemplary and by no ways limit the scope of the present invention.

Next, back-gate oxide layer 16 is formed atop a surface of Si-containing layer 14 utilizing a conventional thermal growing process. Alternatively, back-gate oxide layer 16 may be formed by a conventional deposition process including, but not limited to: chemical vapor deposition (CVD), plasma-assisted CVD, chemical solution deposition, sputtering and evaporation. The back-gate oxide layer is a thin oxide layer that has a thickness of from about 1 to about 10 nm. The resultant structure is shown, for example, in FIG. 2. Note that the bottom Si-containing substrate of the initial SOI wafer has been omitted from this drawing as well as some of the remaining drawings for clarity. The bottom Si-containing substrate is intended to be included in the drawings up until the point in which bottom Si-containing substrate 10 is removed (see, FIG. 10). The thickness of layer 14 illustrated in FIG. 2 has been shown to be thicker than the original thickness of layer 14 in FIG. 1 for clarity.

A first layer of polysilicon 18 is then formed atop polysilicon back-gate oxide layer 16 utilizing a conventional deposition process such as CVD, plasma-assisted CVD, sputtering, chemical solution deposition, and evaporation. The thickness of first polysilicon layer 18 is not critical to the present invention, but typically first polysilicon layer 18 has a thickness of from about 25 to about 75 nm. The resultant structure including first polysilicon layer 18 is shown, for example, in FIG. 3.

Figure 4:
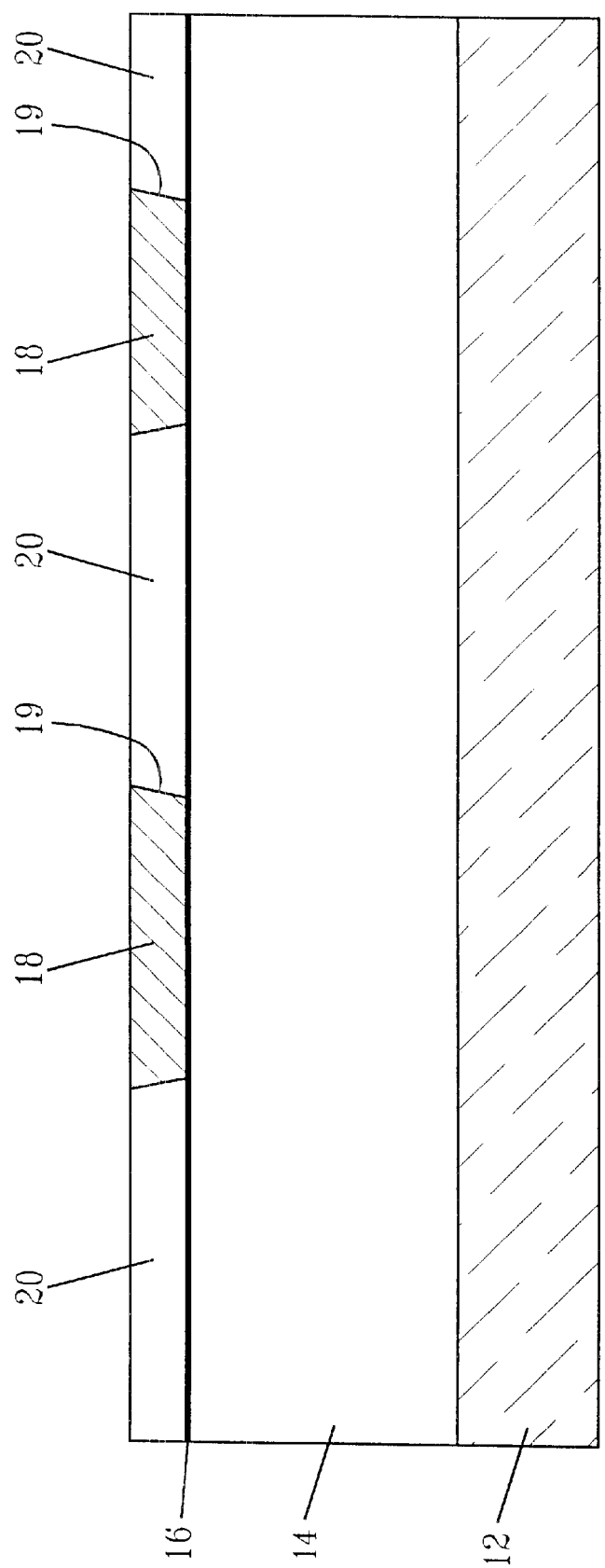

FIG. 4 shows the structure that is formed after various trenches 20, which subsequently will be used to form back-gate-STI (shallow trench isolation) regions 22, are formed into the structure shown in FIG. 3. As shown, the trenches are formed through first polysilicon layer 18 stopping atop back-gate oxide layer 16. An alternating pattern of trenches and polysilicon is formed. Note that the remaining polysilicon abutting each trench now contains under-cut sidewalls 19. It is noted that the actual number of trenches may exceed the number shown in the drawings.

The trenches shown in FIG. 4 are formed utilizing conventional lithography and etching. The lithography step used in forming the trenches comprises the steps of: applying a photoresist (not shown) to the upper horizontal surface of first polysilicon layer 18, exposing the photoresist to a pattern of radiation, and developing the pattern into the exposed photoresist utilizing a conventional resist developer. The etching step, which may be conducted in a single step or multiple etching steps, includes the use of an anisotropic dry etching process such as reactive-ion etching, plasma etching or ion beam etching which is capable of undercutting the polysilicon regions that are protected by the patterned photoresist. The etching step forms trenches 20 into the structure which will be subsequently filled with an insulating material. Trenches 20 formed at this point of the present invention typically have a trench depth that is dependent upon the thickness of first polysilicon layer 18.

After the trenches have been formed, the photoresist is removed from the structure utilizing a conventional resist stripping process and thereafter the structure is subjected to an optional oxidation process which can be used to form a thin liner (not separately labeled) on under-cut sidewalls 19 as well as the bottom wall of the trench. Next, the trenches (with or without the optional liner) are filled with a dielectric material such as TEOS (tetraethylorthosilicate) utilizing a conventional deposition process such as CVD or plasma-assisted CVD and thereafter the structure is planarized utilizing a conventional planarization process such as chemical-mechanical polishing (CMP) or grinding, stopping on the upper surface of first polysilicon layer 18. An optional densification step may be performed after filling the trench, but prior to planarization. The resultant structure, which now includes back-gate-STI regions 22, is shown, for example, in FIG. 5.

Figure 5:
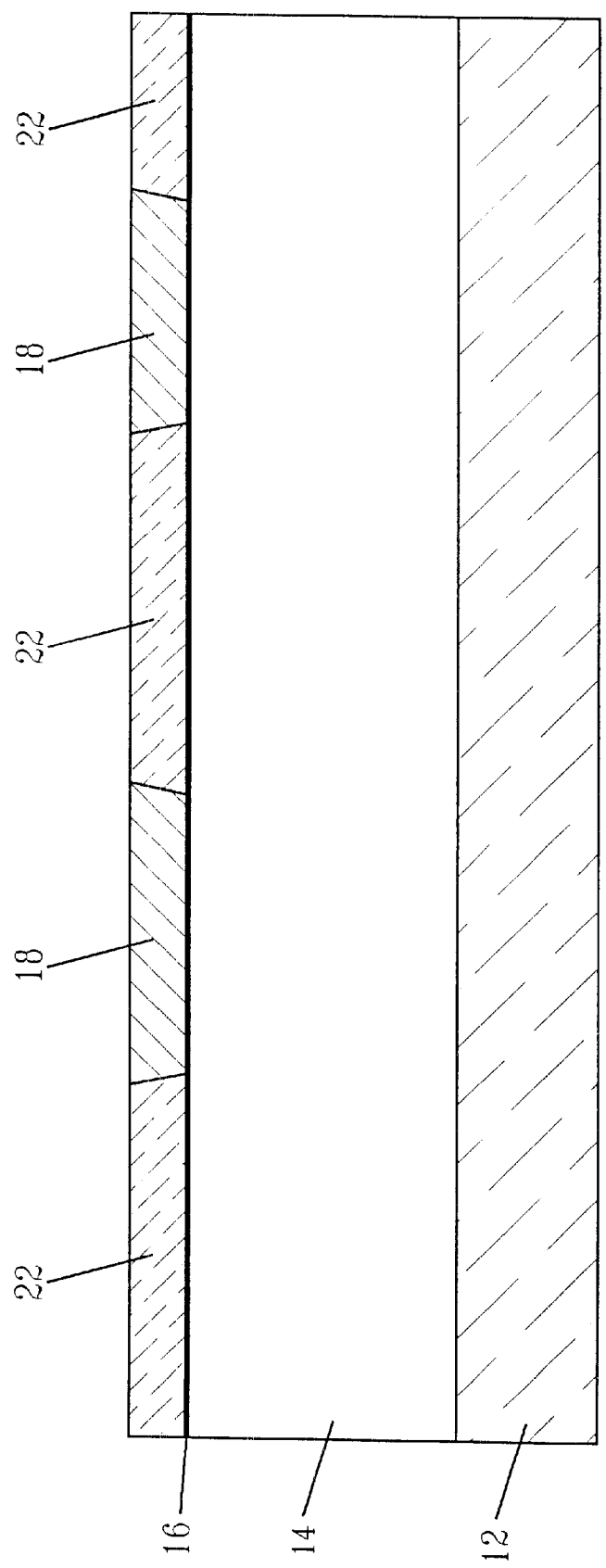
Figure 6:
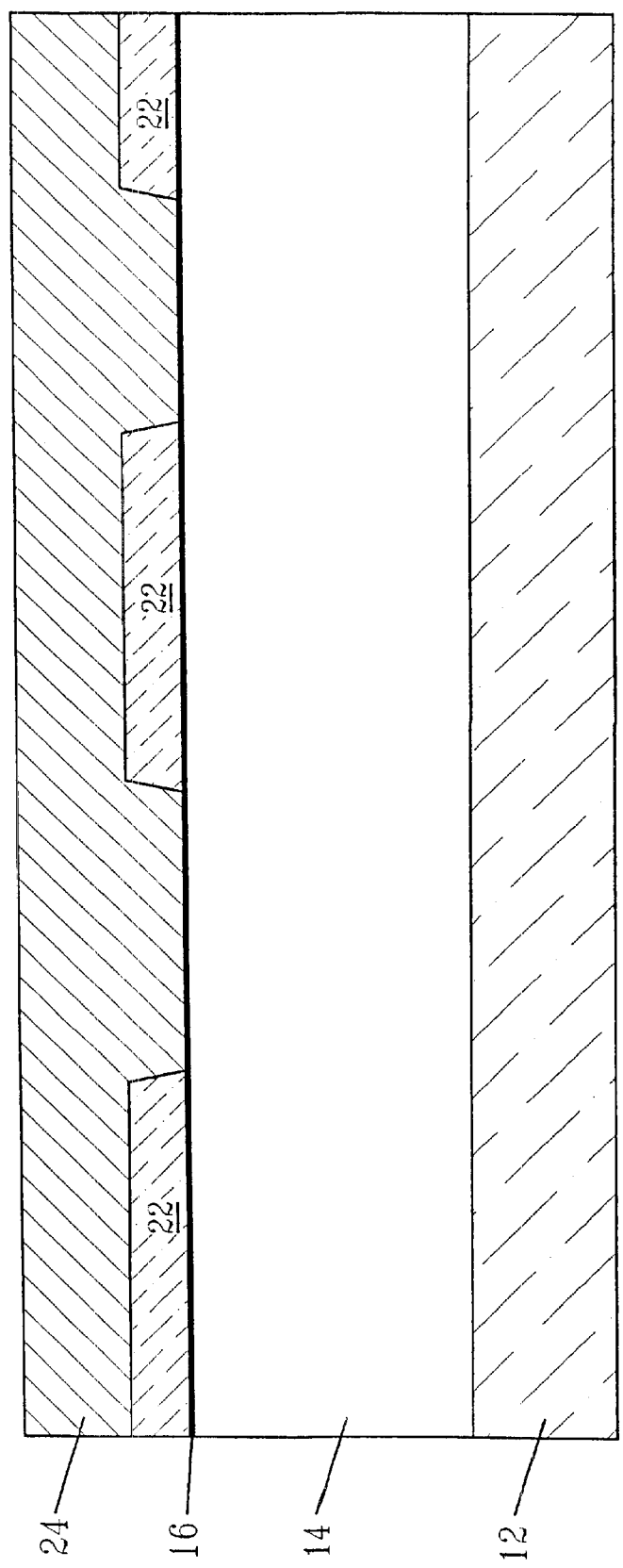

Second polysilicon layer 24 is formed atop the planarized structure shown in FIG. 5 so as to provide the structure shown in FIG. 6. The second polysilicon layer may be formed utilizing one of the above-mentioned methods used in forming first polysilicon layer 18. The thickness of second polysilicon layer 24 may vary, but typically second polysilicon layer 24 has a thickness of from about 25 to about 125 nm.

Next, back-gate region 26 (see, FIG. 7) is formed into the first and second polysilicon layers by ion implanting and annealing. For NMOS devices, the back-gate is formed by ion implanting an N, more preferably a P type dopant into the polysilicon layers. For PMOS devices, P, or more preferably N type dopants are ion implanted into the polysilicon layers. The dopant concentration may vary depending on whether a P type dopant or an N type dopant is employed. Both types of dopant typically have a concentration of about 5E19 atoms/cm$^3$ or greater. Note that this step of the present invention creates a natural separation between the NMOS and the PMOS back-gates because a diode can be formed into the polysilicon region.

The ion implantation (represented by the arrows in FIG. 7) is performed utilizing conventional techniques well-known to those skilled in the art, whereas annealing is performed under conditions that will diffuse and activate the dopant regions. Specifically, annealing is conducted in an inert gas ambient such as Ar, $N_2$ or He at a temperature of about 800° C. or greater for a time period of about 5 seconds or greater. The structure, which is formed after formation of back-gate region 26, is shown, for example, in FIG. 7.

Figure 7:
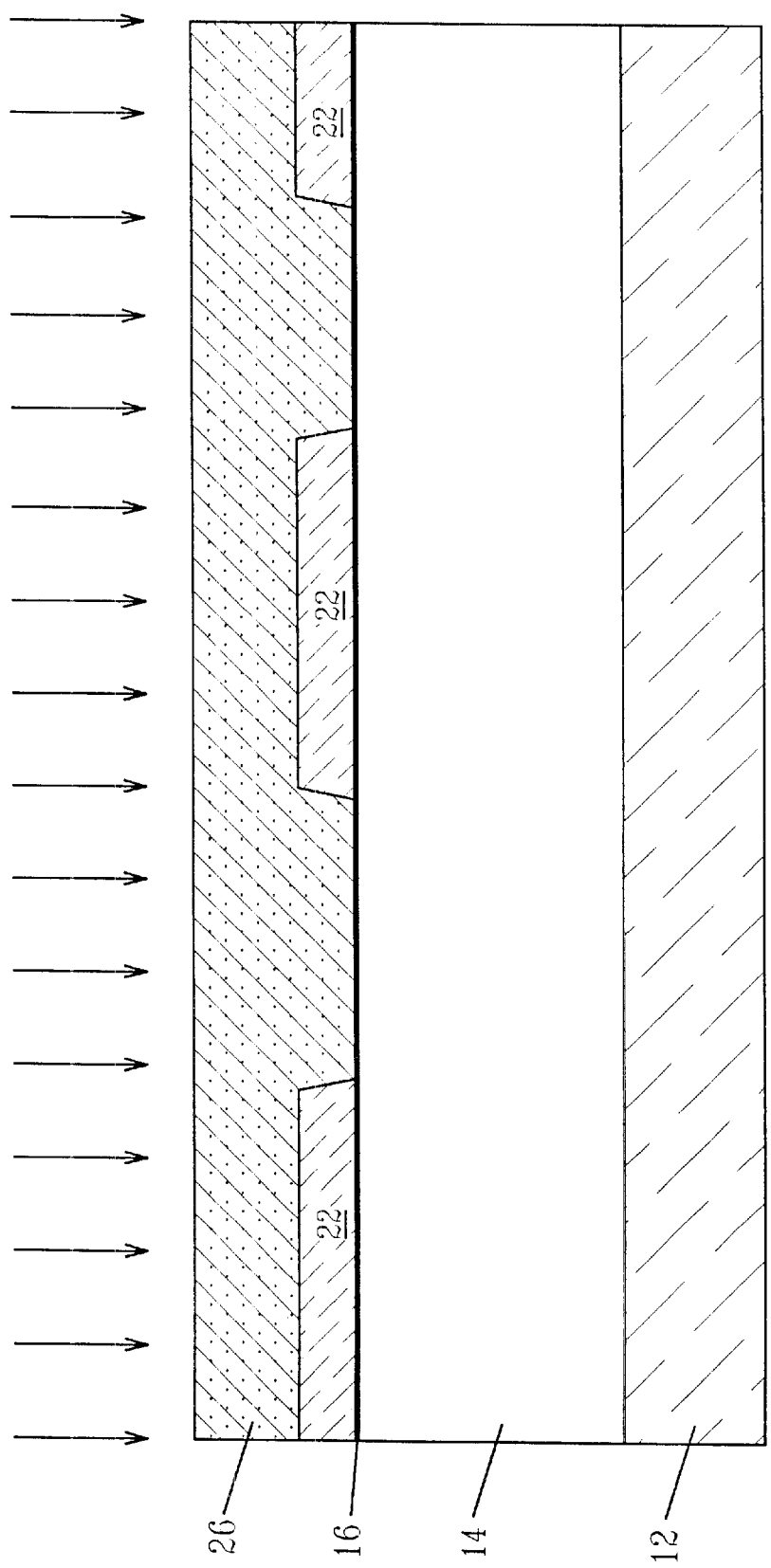

A layer of TEOS (tetraethylorthosilicate) or other like oxide 28 (see, FIG. 8) is then formed atop the structure shown in FIG. 7 utilizing a conventional deposition process well-known to those skilled in the art. Specifically, the layer of TEOS or other like oxide is formed by CVD, plasma-assisted CVD, evaporation, or chemical solution deposition. The thickness of this oxide layer may vary, but typically oxide layer 28 has a thickness of about 100 nm.

Holding-substrate wafer 30 which is comprised of a Si-containing material is then provided, brought into intimate contact with the structure shown in FIG. 7 and thereafter bonded to the upper surface of oxide layer 28. The resultant bonded structure is shown, for example, in FIG. 8.

In one embodiment, the bonding step of the present invention includes heating the two wafers at a temperature of from about 900° to about 1100° C. for a time period of from about 1.5 hours to about 2.5 hours. In one preferred embodiment of the present invention, the wafers are bonded together at a temperature of about 1050° C. for a time period of about 2 hours. It should be noted that when such a high-temperature bonding process is utilized, the dopants implanted into back-gate region 26 must be shallow so as to avoid outdiffusion of dopants from the back-gate region into Si-containing layer 14.

In another embodiment of the present invention, the bonding step is performed utilizing the room-temperature bonding process described in co-assigned U.S. application Ser. No. 10/202,329 filed Jul. 24, 2002, the entire content of which is being incorporated herein by reference. The term "room temperature bonding process" denotes a bonding process that is carried out at a temperature of from about 180 to about 27° C., with a temperature of from about 20° to about 25° C. being more highly preferred. The room temperature bonding process is typically carried out in an inert ambient such as He, $N_2$ or Ar and an external force may be applied to the structure to aide in the bonding process.

Figure 8:
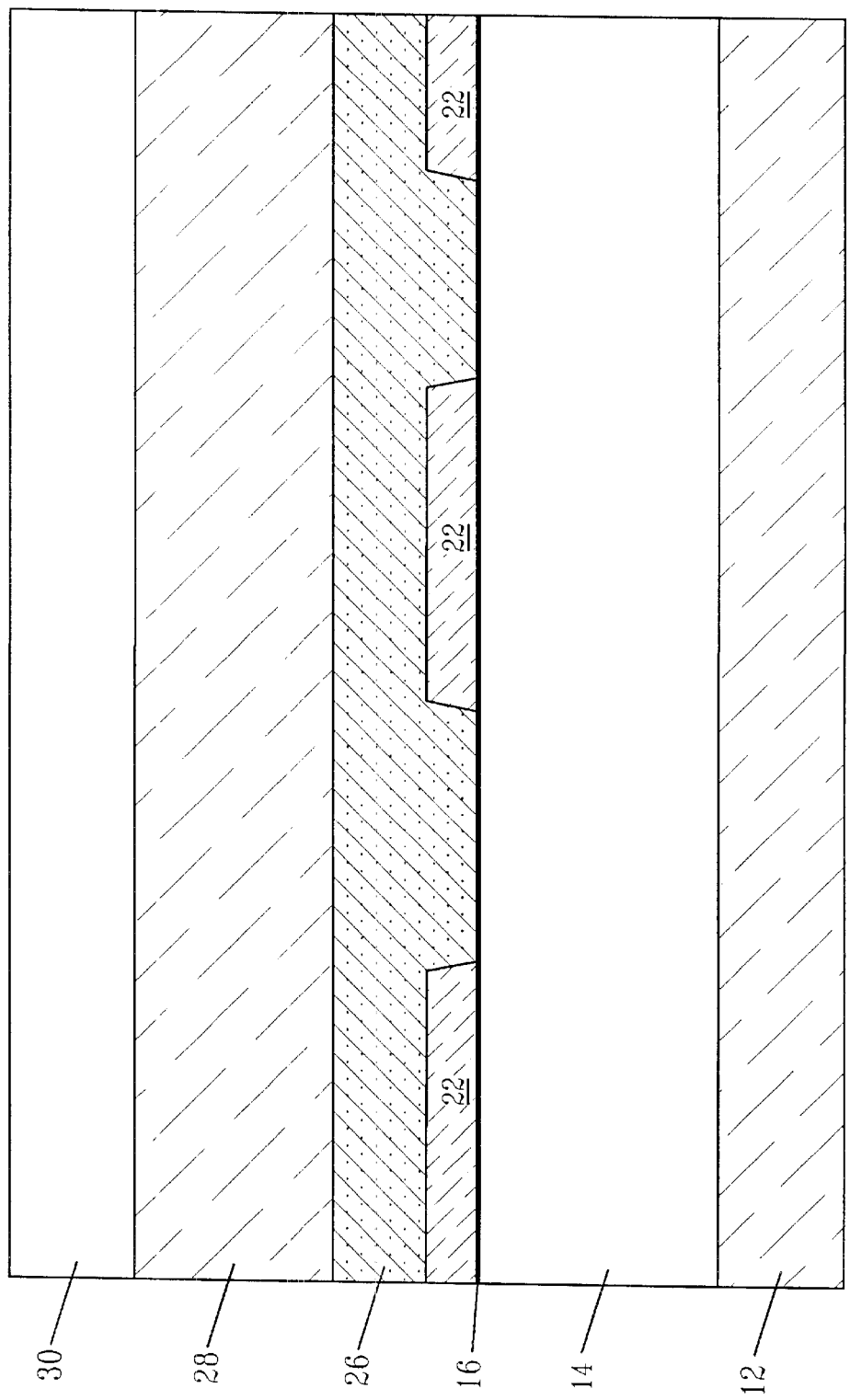
Figure 9:
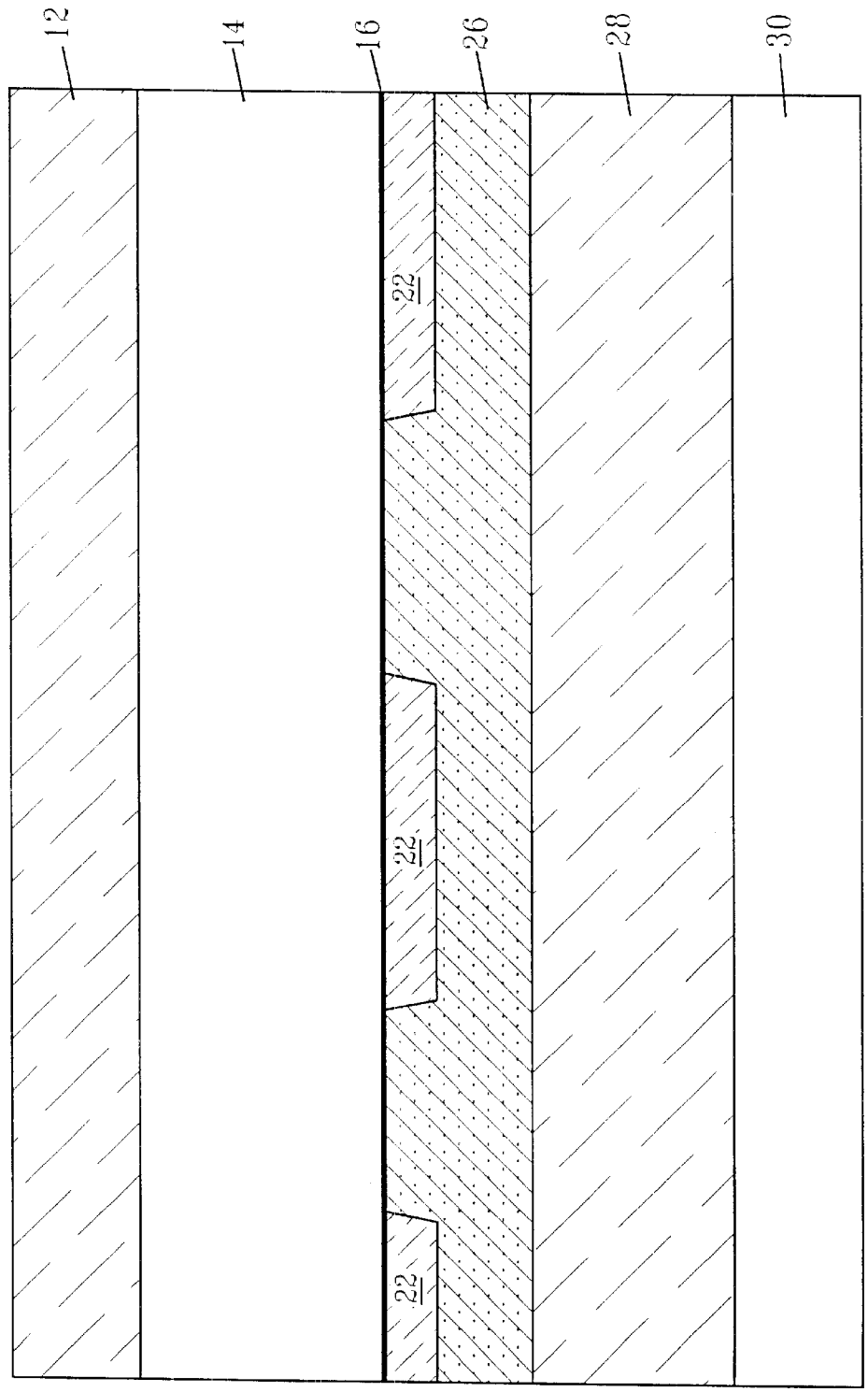

The bonded structure shown in FIG. 8 is then flipped as shown in FIG. 9 such that the holding-substrate wafer represents the bottom most portion of the bonded structure. Note that Si-containing substrate 10 (not shown) now becomes the uppermost layer of the bonded structure.

Figure 10:
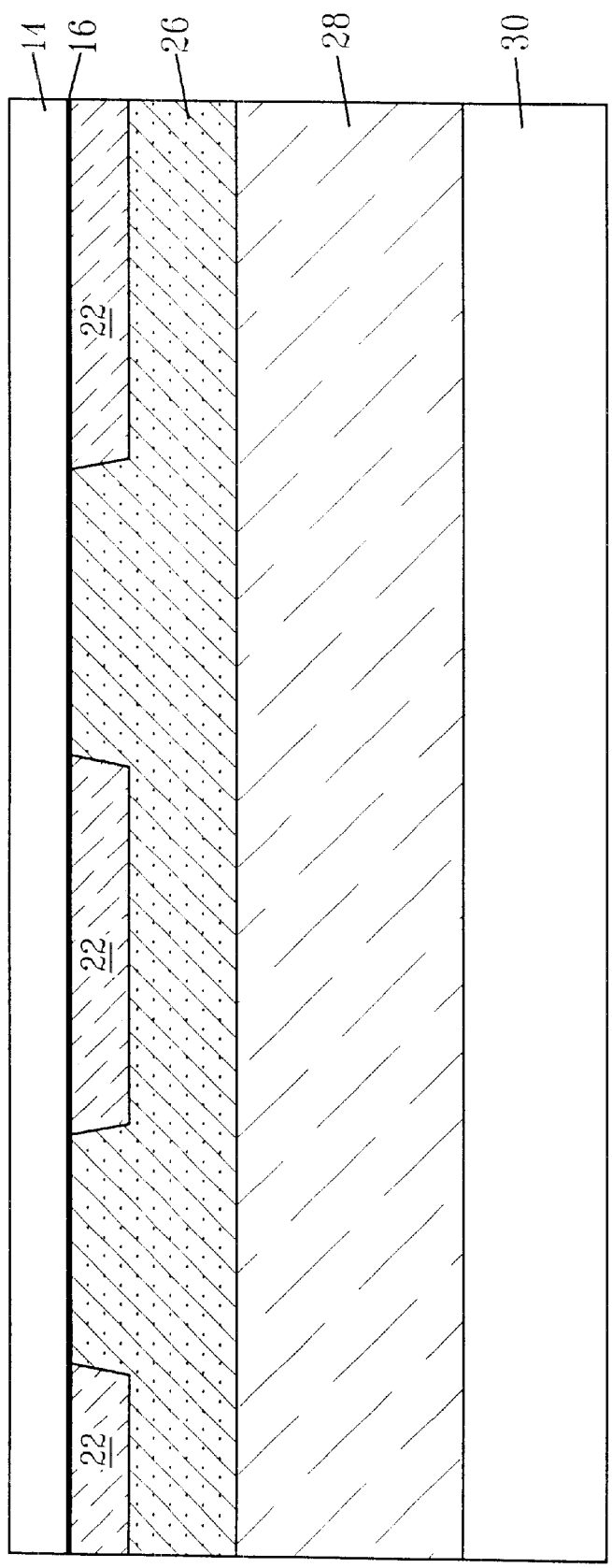

Si-containing substrate 10 and buried oxide layer 12 are then removed and thereafter Si-containing layer 14 is thinned by repeated oxidation and HF etching providing the structure shown, for example, in FIG. 10. In the resultant structure, Si-containing layer 14 is now the uppermost layer of the structure. The removal of the Si-containing substrate and the buried oxide layer are achieved in the present invention utilizing conventional processes that are well-known in the art. For example, Si-containing substrate 10 and buried oxide region 12 may be removed utilizing a single polishing step such as CMP or grinding, or alternatively, the various layers are removed utilizing distinct and separate removal processing steps. The use of distinct, and separate removal processes is preferred herein since it provides for more selectively and ensures that the removal process stops on Si-containing layer 14.

When distinct, and separate removal processes are employed in the present invention, Si-containing substrate 10 is first removed, stopping on buried oxide region 12, by utilizing a CMP process which has a high selectivity for removing a Si-containing material as compared with oxide. Next, an oxidation process may optionally be performed to ensure that only oxide remains on the exposed surface of the bonded wafer. After removal of Si-containing substrate 10, and optionally performing the oxidation step, a conventional chemical wet etching process that has a high-selectivity for removing oxide as compared to Si-containing material is employed. For example, an HF etching process can be employed in the present invention for removing buried oxide layer 12 from the bonded structure. Note that the various removal processes expose Si-containing layer 14.

Figure 11:
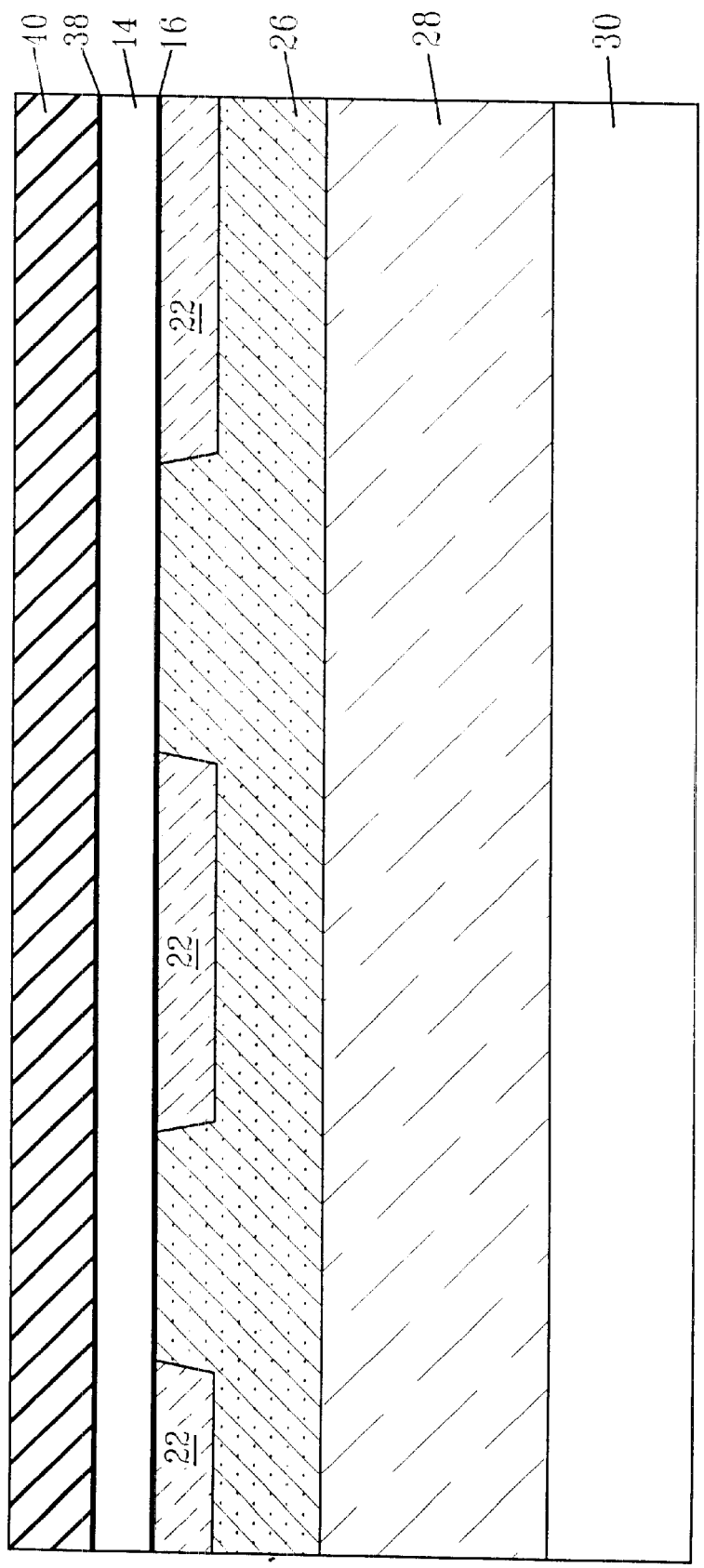

FIG. 11 shows the resultant structure that is formed after sacrificial oxide layer 38 and nitride layer 40 are formed atop the exposed surface of Si-containing layer 14. Sacrificial oxide layer 38 may be formed by a thermal oxidation process, or alternatively sacrificial oxide layer 38 can be formed by a conventional deposition process such as CVD or plasma-assisted CVD. The thickness of the sacrificial oxide layer is not critical to the present invention, but typically, sacrificial oxide layer 38 has a thickness of from about 3 to about 10 nm.

Nitride layer 40 is formed atop sacrificial oxide layer 38 utilizing a conventional deposition process such as CVD or plasma-assisted CVD. The thickness of nitride layer 40 is also not critical to the present invention, but typically nitride layer 40 has a thickness of from about 30 to about 80 nm.

Next, top trench isolation regions 42 are formed into the structure shown in FIG. 11 utilizing the technique that was previously used in forming the back-gate-STI regions. The resultant structure including top trench isolation regions 42 is shown, for example, in FIG. 12. Note that the top trench isolation regions are formed through nitride layer 40, sacrificial oxide layer 38, Si-containing layer 14 and a portion of back-gate region 26. Following the formation of the top trench isolation regions, nitride layer 40 is removed from the structure utilizing a wet etch process such as hot phosphoric acid. Note a timed HF etching process may be employed to ensure that top trench isolation regions 42 are coplanar with the sacrificial oxide layer.

Figure 12:
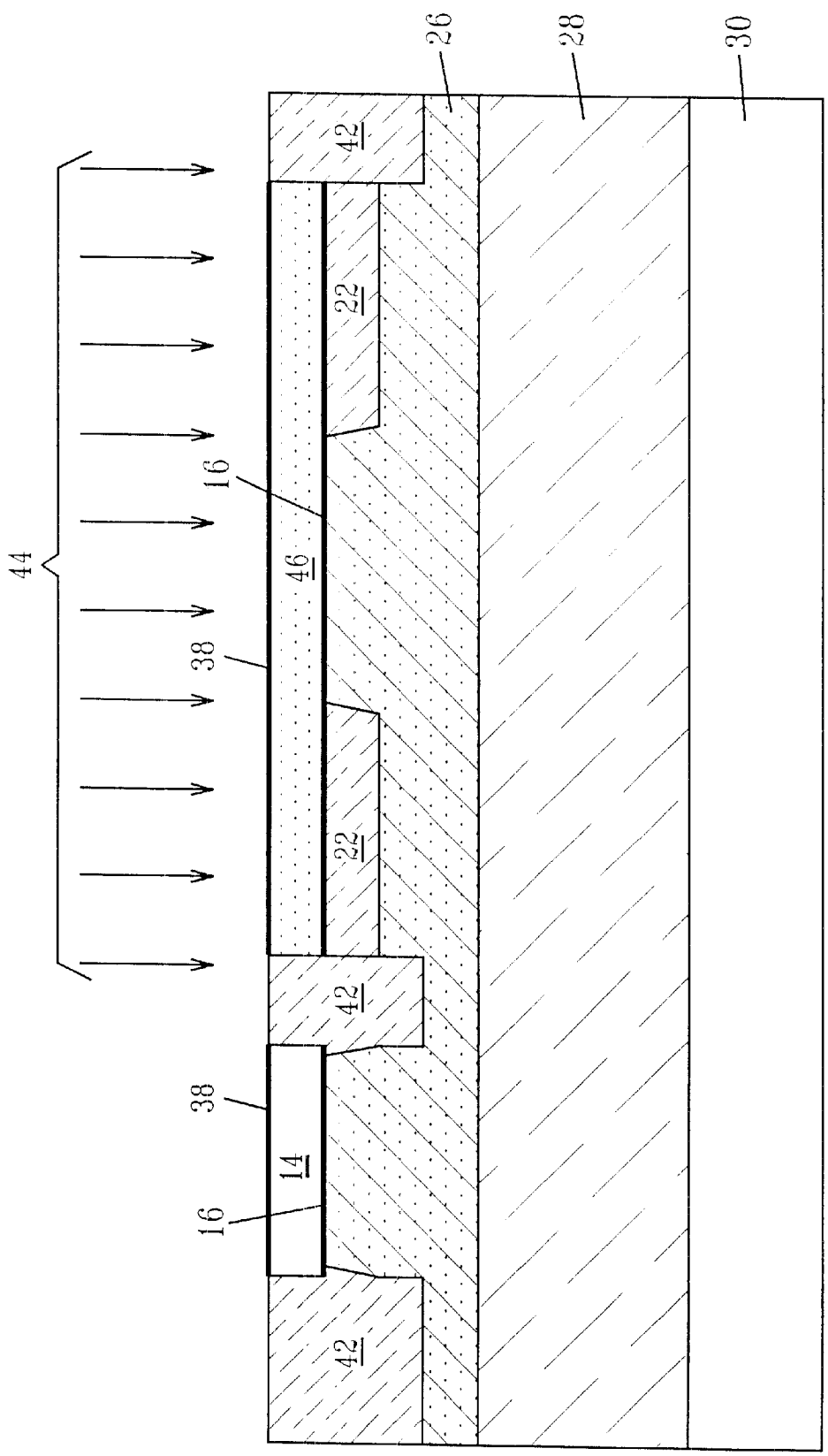

FIG. 12 also shows ions 44 being implanted into portions of Si-containing layer 14. The region where ions 44 are being implanted becomes body region 46 of the device. A masked ion implantation process utilizing standard implantation conditions is employed in forming body region 46. Following body implantation, a conventional annealing process which is conducted in an inert ambient is performed to activate the body region. Although various annealing temperatures and times may be employed in the present invention in activating the body region, it is preferred to anneal in Ar at a temperature of about 1000° C. for about 5 seconds.

Figure 13:
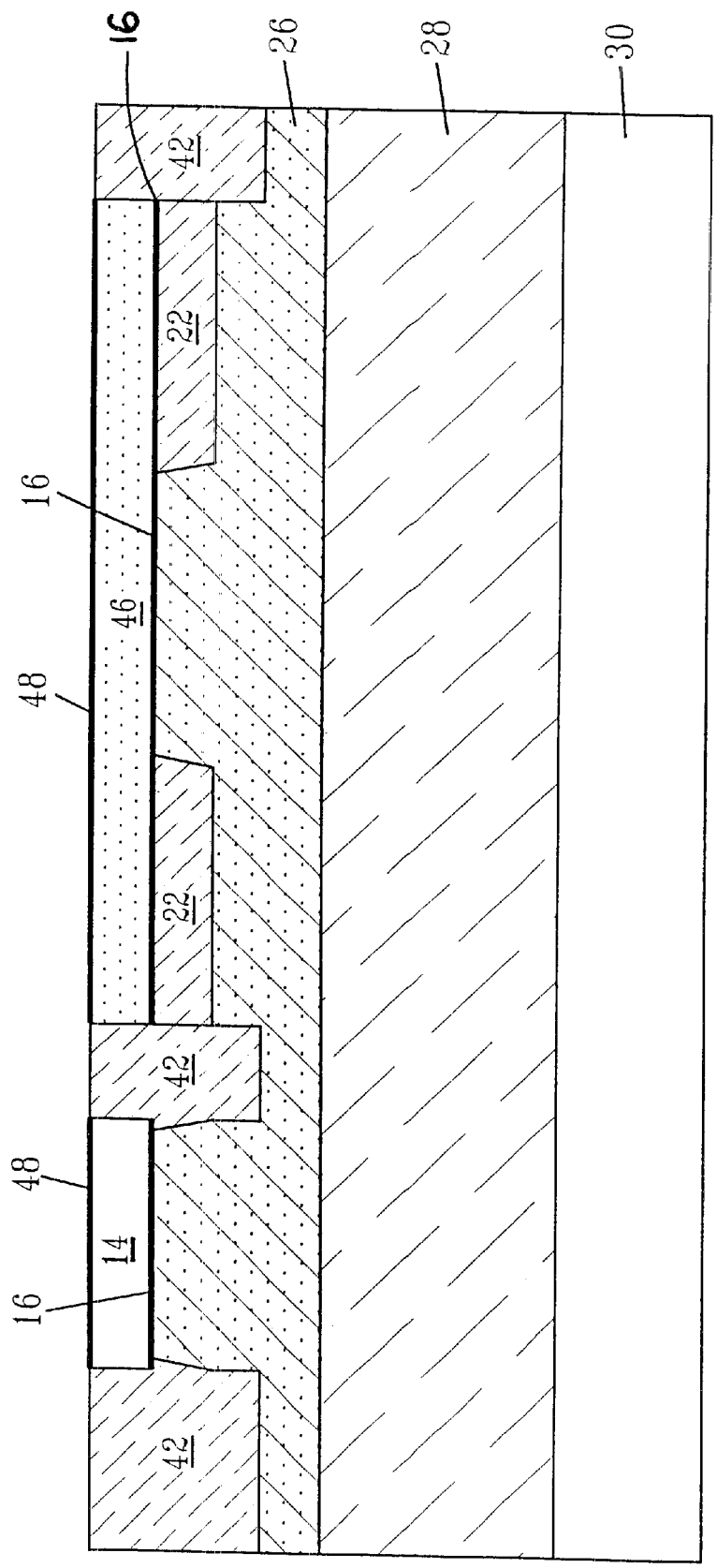

FIG. 13 shows the structure that is formed after removing sacrificial oxide layer 38 from the structure so as to expose underlying body region 46 and Si-containing layer 14. Specifically, sacrificial oxide layer 38 is removed from the structure utilizing a conventional wet etching process wherein a chemical etchant that is highly selective in removing an oxide is employed. For example, HF can be used to remove the sacrificial oxide layer from the structure.

Figure 14:
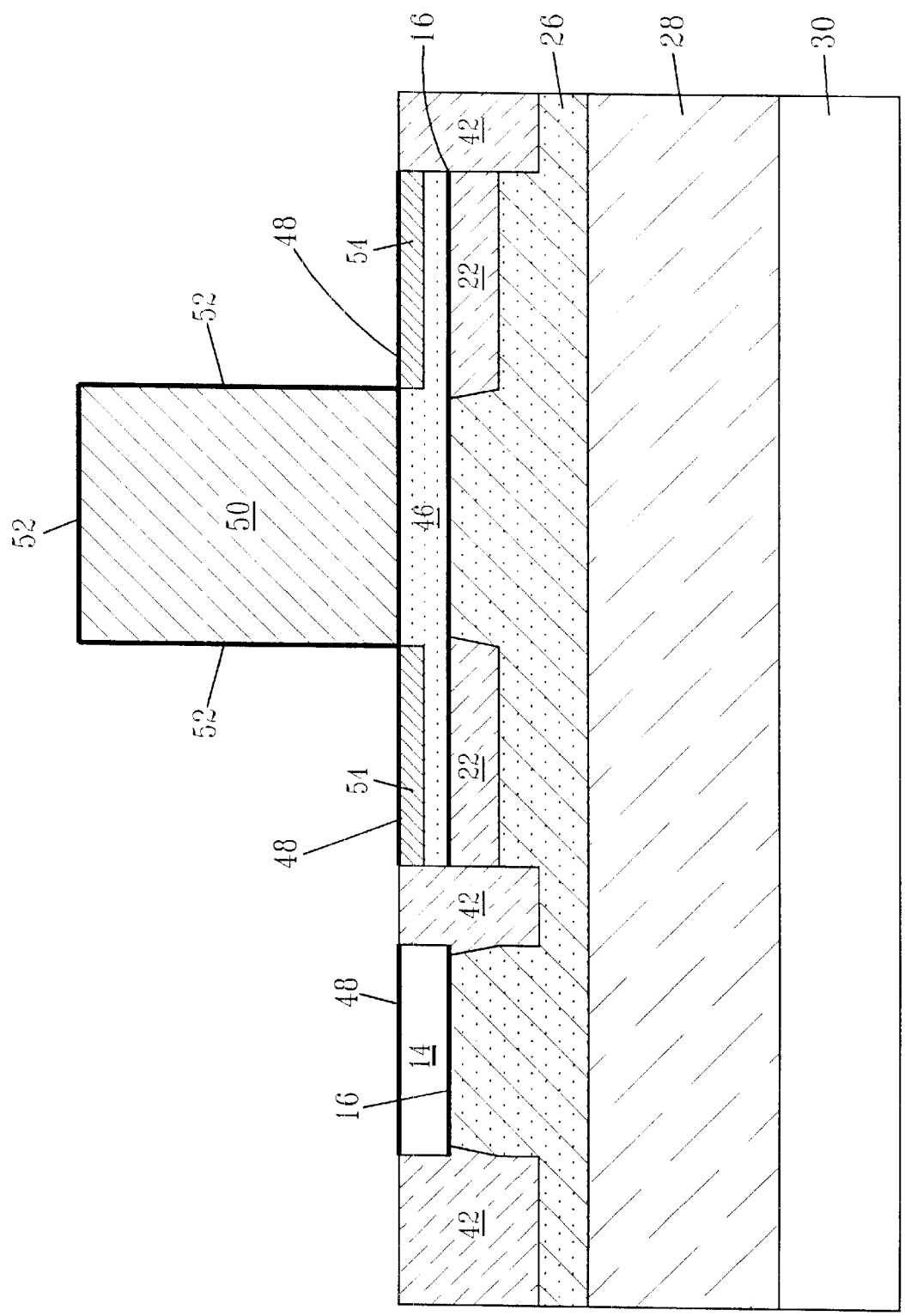

Next, gate dielectric 48 is formed on the exposed Si-containing surface which includes body region 46 so as to provide the structure shown, for example, in FIG. 14. Gate dielectric 48 is formed on the exposed surfaces of body region 46 as well as Si-containing layer 14 utilizing a conventional thermal growing process. The gate dielectric, which represents the front gate dielectric of the device, is a thin layer having a thickness of from about 1 to about 5 nm. The gate dielectric may be composed of a conventional oxide such as, but not limited to: $SiO_2$, $Al_2O_3$, $Ta_2O_3$, $TiO_2$, and perovskite-type oxides.

Figure 15:
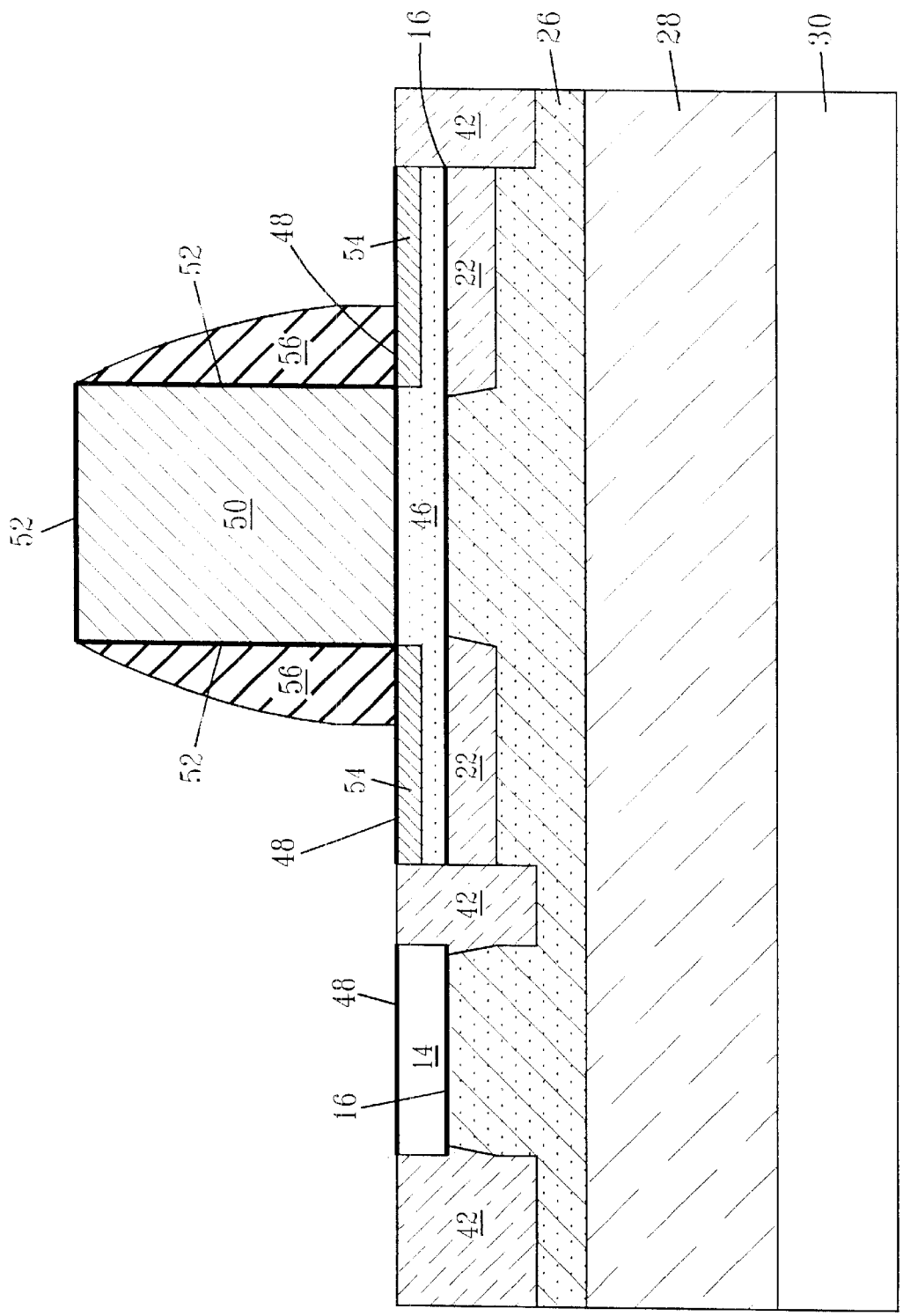

Following formation of the gate dielectric, polysilicon gate 50 (which functions as the front-side gate) is formed over portions of the gate dielectric that overlays body region 46, See FIG. 15. The gate which is composed of doped polysilicon is formed by first depositing polysilicon atop the gate dielectric utilizing a conventional deposition process and then lithography and etching is used in forming the final gate structure. The polysilicon is either doped in-situ during the deposition process, or alternatively, the polysilicon gate can be doped after deposition using conventional ion implantation and annealing. In another embodiment, the polysilicon gate can be doped at the same time as formation of the source/drain regions.

The polysilicon gate is then subjected to a gate re-oxidation process which is capable of forming oxide liner 52 (See, FIG. 14) about the gate's vertical sidewalls and its top horizontal surface. The re-oxidation is performed in an oxidizing ambient such as $O_2$ or air at a temperature of about 800° C. or greater for a time period of about 5 minutes or less.

Following the re-oxidation process, source/drain extension regions 54 (See, FIG. 15) are formed in body region 46 utilizing conventional ion implantation and annealing. An optional halo implant region, not shown, may also be formed. Although annealing may be conducted utilizing various conditions, it is preferred to anneal the source/drain extension implants in Ar at a temperature of about 900° C. for a time period of 5 seconds.

Figure 16:
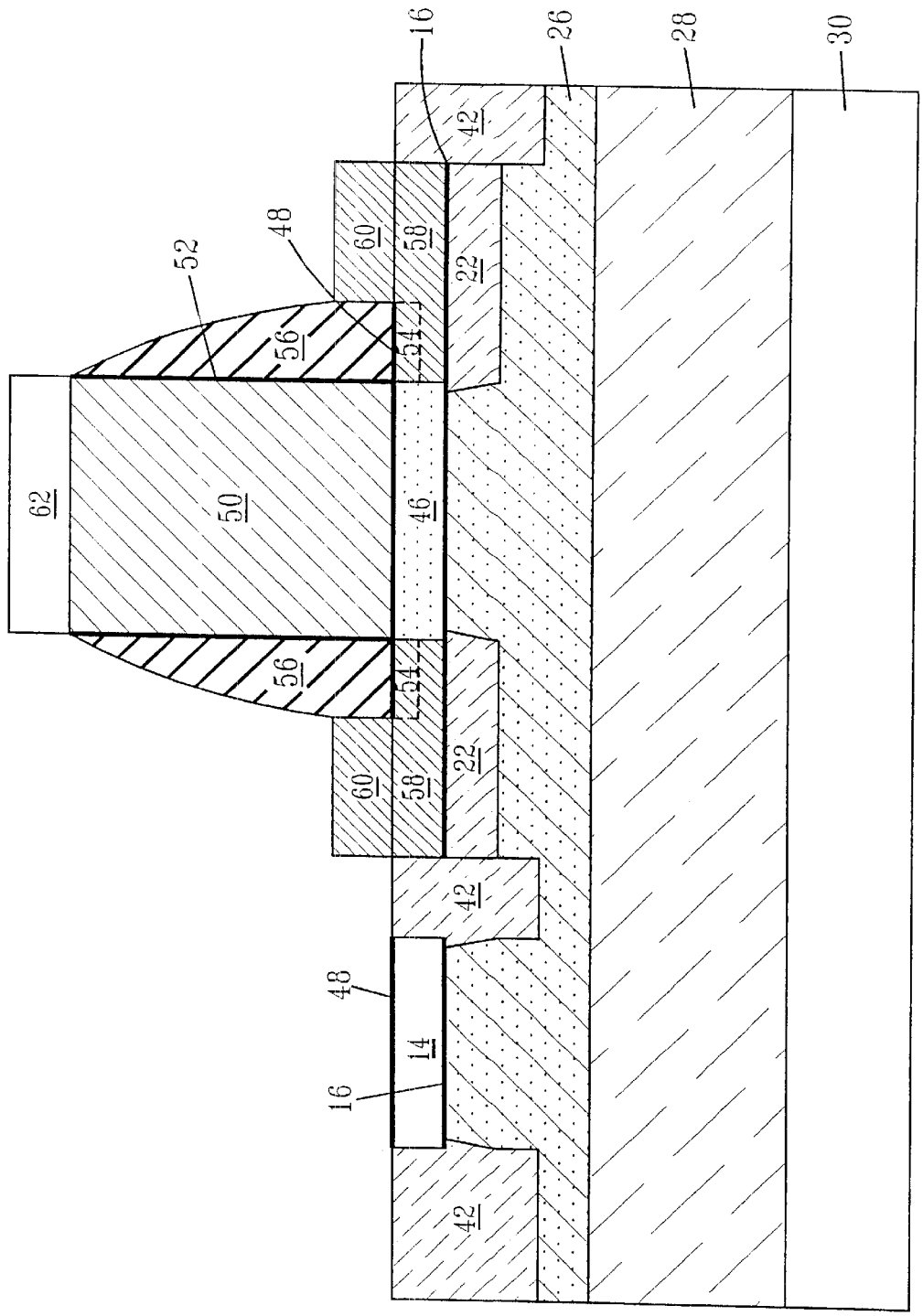

Spacers 56, which may be composed of a nitride, oxynitride or a combination thereof, are then formed about the vertical sidewalls of the polysilicon gate. The spacers are formed by deposition of an insulating material followed by etching. FIG. 16 shows the resultant structure having spacers 56 formed about the vertical sidewalls of the polysilicon gate.

After spacer formation, source/drain regions 58 (See, FIG. 16) are formed into body region 46 abutting each spacer utilizing a conventional ion implantation and annealing process. Although various annealing conditions can again be employed, it is preferred to conduct the annealing in Ar at a temperature of about 1000° C. for a time period of about 5 seconds.

Next, the gate dielectric abutting the spacers is removed from the structure utilizing an etching process that is highly selective in removing gate dielectric, e.g., an oxide, as compared to polysilicon or spacer material. Note that this etching step exposes the source/drain regions that were previously formed into the body region of the device.

After exposing the source/drain regions, raised source/drain regions 60, as depicted in FIG. 16, are formed utilizing conventional processes well-known to those skilled in the art. Specifically, the raised/source drain regions are formed by depositing a layer of epi polysilicon or Si on the exposed source/drain regions, and doping the thus deposited epi Si or Si layer by ion implanting and annealing. Note that a layer of epi Si or Si (denoted by reference numeral 62) is formed atop the gate.

Figure 17:
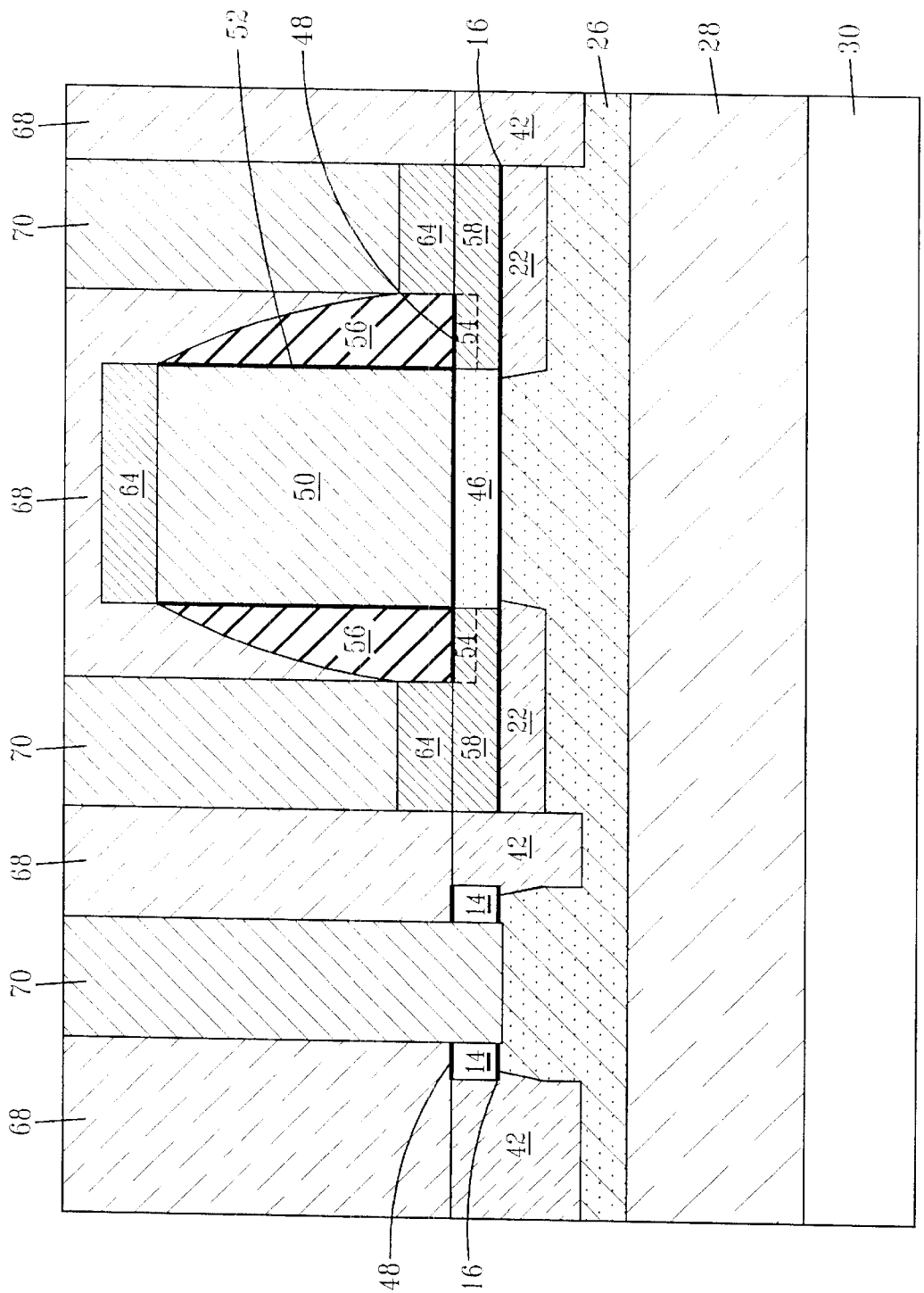

Next, and as shown in FIG. 17, conventional BEOL processing steps may be performed so as contact the device shown in FIG. 16 to external devices and/or other devices that may be present in the structure. Included in the BEOL processing steps is converting the raised source/drain regions and layer 62 atop the gate into silicide regions 64 by utilizing a conventional salicidation process; forming a layer of insulating material 68 such as BPSG (boron doped phosphorus silicate glass) by deposition and planarizing the same; providing contact openings into insulating layer 68 by lithography and etching; and filling the contact holes with conductive material 70. The conductive material employed includes, but is not limited to: Cu, Al, W, polysilicon and other like conductive materials. Note that the contact region which extends to the surface of the back-gate is the back-gate contact, while the contact regions which extend to the source/drain regions are referred to as S/D contacts.

The polysilicon back-gate region 26 is capable of controlling the threshold voltage of the front-gate, i.e., polysilicon gate 50, because the surface potentials at the front and back interfaces are strongly coupled to each other and capacitively coupled to the front and back-gate dielectrics, respectively. Therefore, the potential through the silicon film, and hence the charge, is determined by the bias conditions on both the front and back-gates. In other words, the back-gate controls the threshold voltage of the front-gate device.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated but fall within the scope of the appended claims.

Having thus described our invention in detail, what we claim as new and desire to secure by the Letters Patent is:

1. A silicon-on-insulator (SOI) metal oxide field effect transistor (MOSFET) device comprising:

an implanted back-gate region located atop an oxide layer, wherein a surface portion of said implanted back-gate region includes a back-gate oxide formed thereon;

a body region located atop said back-gate oxide;

a gate dielectric located atop a surface portion of said body region; and a polysilicon gate located atop a portion of said gate dielectric.

2. The SOI MOSFET of claim 1 further comprising back-gate-STI regions located under portions of said body region.

3. The SOI MOSFET device of claim 1 wherein said body region further includes source/drain regions and source/drain extension regions.

4. The SOI MOSFET device of claim 1 wherein said polysilicon gate includes spacers on sidewalls thereof.

5. The SOI MOSFET device of claim 1 further comprising raised source/drain regions located atop a portion of said body region.

6. The SOI MOSFET device of claim 1 further comprising silicide regions located atop a portion of said body region and atop the polysilicon gate.

7. The SOI MOSFET device of claim 1 further comprising a dielectric material encapsulating said polysilicon gate.

8. The SOI MOSFET device of claim 7 wherein said dielectric material includes conductive filled contact holes.

9. The SOI MOSFET device of claim 1 wherein said implanted back-gate serves as a threshold control system for the polysilicon gate.

* * * * *

UNITED STATES PATENT AND TRADEMARK OFFICE
CERTIFICATE OF CORRECTION

PATENT NO. : 6,664,598 B1  Page 1 of 1
DATED : December 16, 2003
INVENTOR(S) : Robert H. Dennard et al.

It is certified that error appears in the above-identified patent and that said Letters Patent is hereby corrected as shown below:

<u>Column 5,</u>
Line 60, "180" should read -- 18º --

Signed and Sealed this

Twenty-third Day of March, 2004

JON W. DUDAS
*Acting Director of the United States Patent and Trademark Office*